(12) United States Patent
Huang et al.

(10) Patent No.: US 7,968,926 B2
(45) Date of Patent: Jun. 28, 2011

(54) LOGIC NON-VOLATILE MEMORY CELL WITH IMPROVED DATA RETENTION ABILITY

(75) Inventors: Chin-Yi Huang, Hsin-Chu (TW); Te-Hsun Hsu, Hsin-Chu (TW); Cheng Hsiang Huang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 515 days.

(21) Appl. No.: 12/022,943

(22) Filed: Jan. 30, 2008

(65) Prior Publication Data

US 2009/0159946 A1 Jun. 25, 2009

Related U.S. Application Data

(60) Provisional application No. 61/015,050, filed on Dec. 19, 2007.

(51) Int. Cl.
*H01L 27/112* (2006.01)
(52) U.S. Cl. .......... 257/300; 257/315; 257/E27.103
(58) Field of Classification Search .......... 257/300, 257/306, 315, E27.102, E27.103
See application file for complete search history.

(56) References Cited

U.S. PATENT DOCUMENTS

| | | | |
|---|---|---|---|
| 4,748,593 A * | 5/1988 | Topich et al. | 365/185.07 |
| 4,858,185 A * | 8/1989 | Kowshik et al. | 365/185.07 |
| 5,293,337 A | 3/1994 | Aritome et al. | |
| 5,295,096 A | 3/1994 | Nakajima | |
| 5,323,039 A | 6/1994 | Asano et al. | |
| 5,446,303 A | 8/1995 | Quill et al. | |
| 5,793,673 A | 8/1998 | Pio et al. | |
| 5,889,700 A | 3/1999 | Bergemont et al. | |
| 6,172,392 B1 | 1/2001 | Schmidt et al. | |
| 6,295,229 B1 | 9/2001 | Chang et al. | |
| 6,512,699 B2 | 1/2003 | Ogane | |
| 6,529,407 B2 * | 3/2003 | Shukuri | 365/185.07 |
| 6,734,065 B2 | 5/2004 | Yim et al. | |
| 6,788,574 B1 | 9/2004 | Han et al. | |
| 6,881,626 B2 | 4/2005 | Lee et al. | |
| 7,326,994 B2 | 2/2008 | Hsu et al. | |
| 2002/0100930 A1 | 8/2002 | Yaegashi | |
| 2003/0197238 A1 | 10/2003 | Park | |
| 2004/0217441 A1 | 11/2004 | Lehmann et al. | |
| 2005/0052926 A1 * | 3/2005 | Agata et al. | 365/222 |
| 2007/0120172 A1 | 5/2007 | Hsu et al. | |

* cited by examiner

Primary Examiner — Benjamin P Sandvik
Assistant Examiner — W. Wendy Kuo
(74) Attorney, Agent, or Firm — Slater & Matsil, L.L.P.

(57) ABSTRACT

A memory cell includes a semiconductor substrate; and a first, a second, and a third transistor. The first transistor includes a first dielectric over the semiconductor substrate; and a first floating gate over the first dielectric. The second transistor is electrically coupled to the first transistor and includes a second dielectric over the semiconductor substrate; and a second floating gate over the second dielectric. The first and the second floating gates are electrically disconnected. The memory cell further includes a first capacitor; a second capacitor electrically coupled to the first capacitor; a third capacitor; a fourth capacitor electrically coupled to the third capacitor, wherein each of the first, the second, the third and the fourth capacitors includes the semiconductor substrate as one of the capacitor plates. The third transistor is a selector of the memory cell and is electrically coupled to the first and the second transistors.

19 Claims, 9 Drawing Sheets

US 7,968,926 B2

LOGIC NON-VOLATILE MEMORY CELL WITH IMPROVED DATA RETENTION ABILITY

This application claims the benefit of the following provisionally filed U.S. Patent Application Ser. No. 61/015,050, filed Dec. 19, 2007, entitled "Logic Non-Volatile Memory Cell with Improved Data Retention Ability," which application is hereby incorporated herein by reference.

CROSS-REFERENCE TO RELATED APPLICATION

This application relates to the following commonly assigned U.S. patent application Ser. No. 11/248,357, filed Oct. 12, 2005, entitled "Logic Compatible Non-Volatile Memory Cell," published as U.S. Patent Publication No. 2007/0120172 A1, which patent application is incorporated herein by reference.

TECHNICAL FIELD

This invention relates generally to semiconductor devices, and more particularly to memory cells, and even more particularly to the structure and manufacturing methods of non-volatile memory cells.

BACKGROUND

A non-volatile memory cell retains information stored in the memory cell even when the power is turned off. To create a non-volatile memory cell, typically a standard CMOS-based logic process is used as a starting foundation. Next, additional process steps are incorporated into the logic process flow to create the non-volatile memory cell. Examples of such additional process steps include second polysilicon deposition, junction dopant optimization, etc. Integrating "non-volatile memory"-specific process steps into the standard CMOS-based logic process creates complications. Consequently, embedded non-volatile memory technologies generally lag behind advanced logic fabrication processes by several generations. For a system-on-chip (SoC) approach, which requires embedding a non-volatile memory, a design team may have no choice but to accept a logic flow process usually two to three generations behind the current advanced standard logic process as well as the addition to that process of several additional lithographic masks. This prior approach not only typically increases the wafer cost, but it also falls short of the peak performance that the most advanced standard logic process can deliver.

Also, due to the cycling-induced degradation of the $SiO_2$, the previous technique of subjecting all of the non-volatile memory cell components to the higher program and erase voltages typically hastens the degradation of the $SiO_2$, thus degrading the performance and reliability of the non-volatile memory cell.

Structures and fabrication methods have therefore been explored to solve the above-discussed problems. U.S. Patent Publication No. 2007/0120172 provides a non-volatile memory cell 100, which is shown in FIG. 1. Memory cell 100 includes transistor 102, erase-tunneling capacitor 104, coupling capacitor 106, and program-tunneling capacitor 108. The erase-tunneling capacitor 104, coupling capacitor 106, and program-tunneling 108 share a common floating gate FG. Coupling capacitor 106 has a significantly greater capacitance than erase-tunneling capacitor 104 and program-tunneling 108 in order to facilitate efficient program and erase operations. In a program operation, program gate PG is applied with a voltage of 9 volts, and erase gate EG is applied with a voltage of 0 volt, so that electrons tunnel from the floating gate FG into the substrate, on which memory cell 100 is formed. As a result, floating gate FG will have positive charges (holes). In an erase operation, program gate PG and erase gate EG are both applied with voltages of 9 volts, and hence a high voltage is coupled to floating gate FG. Since floating gate FG has positive charges, the voltage of the floating gate FG is further increased. With source line SL applied with 0V, electrons are injected into floating gate FG through capacitor 104.

Memory cell 100 may be formed simultaneously with the formation of logic circuits. As a result, the non-volatile memory cell 100 suffers from drawbacks. With the increasing down-scaling of integrated circuits, the thicknesses of gate dielectrics in logic circuits are increasingly reduced. Since the non-volatile memory cell 100 needs to be formed simultaneously with logic circuits, the thickness of non-volatile memory cell 100 has to be the same as the thicknesses of logic circuits, which will also be reduced. The reduced thickness of the gate dielectric under the floating gate FG, however, may result in increased leakage current. The data retention ability of non-volatile memory cell 100 is thus degraded accordingly.

FIG. 2 illustrates test results of sample memory cells having the structure shown in FIG. 1, wherein cumulative percentages are illustrated as the function of bit line currents measured from the sample memory cells. The sample memory cells are baked at 250° C. to accelerate the leakage. Measurement results 120 were obtained before the baking, measurement results 122 were obtained after 24 hours of baking, while measurement results 124 were obtained after 72 hours of baking. It was found that before the baking process, none of the sample memory cells failed. However, as the baking proceeded, increasingly more samples failed. After 72 hours of baking, the failure rate reached about 0.1%. The test results revealed the leakage that will occur if the memory cells are stored for a long time. Therefore, non-volatile memory cells having improved reliability are needed.

SUMMARY OF THE INVENTION

In accordance with one aspect of the present invention, a memory cell includes a semiconductor substrate; and a first, a second, and a third transistor. The first transistor includes a first dielectric over the semiconductor substrate, and a first floating gate over the first dielectric. The second transistor is electrically coupled to the first transistor and includes a second dielectric over the semiconductor substrate; and a second floating gate over the second dielectric. The first and the second floating gates are electrically disconnected. The memory cell further includes a first capacitor; a second capacitor electrically coupled to the first capacitor; a third capacitor; a fourth capacitor electrically coupled to the third capacitor, wherein each of the first, the second, the third and the fourth capacitors includes the semiconductor substrate as one of the capacitor plates. The third transistor is a selector of the memory cell and is electrically coupled to the first and the second transistors.

In accordance with another aspect of the present invention, a memory cell includes a semiconductor substrate; and a first, a second, and a third transistor. The first transistor includes a first dielectric over the semiconductor substrate; and a first floating gate over the first dielectric. The second transistor is electrically coupled to the first transistor, and includes a second dielectric over the semiconductor substrate; and a second floating gate over the second dielectric. The first and the second floating gates are electrically disconnected. Source regions of the first and the second transistors are interconnected, and drain regions of the first and the second transistors are interconnected. The memory cell further includes a first capacitor including the first floating gate as one of capacitor plates; a second capacitor including the first floating gate as one of capacitor plates; a third capacitor including the second floating gate as one of capacitor plates; and a fourth capacitor including the second floating gate as one of capacitor plates. The memory cell further includes a third transistor including a first source/drain region connected to one of the interconnected source regions and the interconnected drain regions of the first and the second transistors.

In accordance with yet another aspect of the present invention, a non-volatile memory cell includes a semiconductor substrate; a first dielectric over the semiconductor substrate; a first floating gate over the first dielectric; a second dielectric over the semiconductor substrate; a second floating gate over the second dielectric and electrically disconnected from the first floating gate; a first, a second and a third implanted region in the semiconductor substrate and adjacent the first floating gate, wherein the first, the second and the third implanted regions are isolated by insulation regions in the semiconductor substrate; a fourth, a fifth and a sixth implanted region in the semiconductor substrate and adjacent the first and the second floating gates, wherein the fourth, the fifth and the sixth implanted regions are isolated by the insulation regions; a seventh, a eighth and a ninth implanted region in the semiconductor substrate and adjacent the second floating gate, wherein the seventh, the eighth and the ninth implanted regions are isolated by the insulation regions; a third gate dielectric over the semiconductor substrate; a word line over the third gate dielectric; a tenth implanted region in the semiconductor substrate and adjacent the word line; and an eleventh implanted region in the semiconductor substrate and adjacent the word line, wherein the eleventh implanted region is electrically connected to the fifth implanted region.

The advantageous features of the present invention include improved reliability of memory cells, and improved data retention time.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel logic non-volatile memory (LNVM) cell and methods of forming the same are provided. The operations and variations of the preferred embodiments are discussed. Throughout the various views and illustrative embodiments of the present invention, like reference numbers are used to designate like elements.

Figure 1:
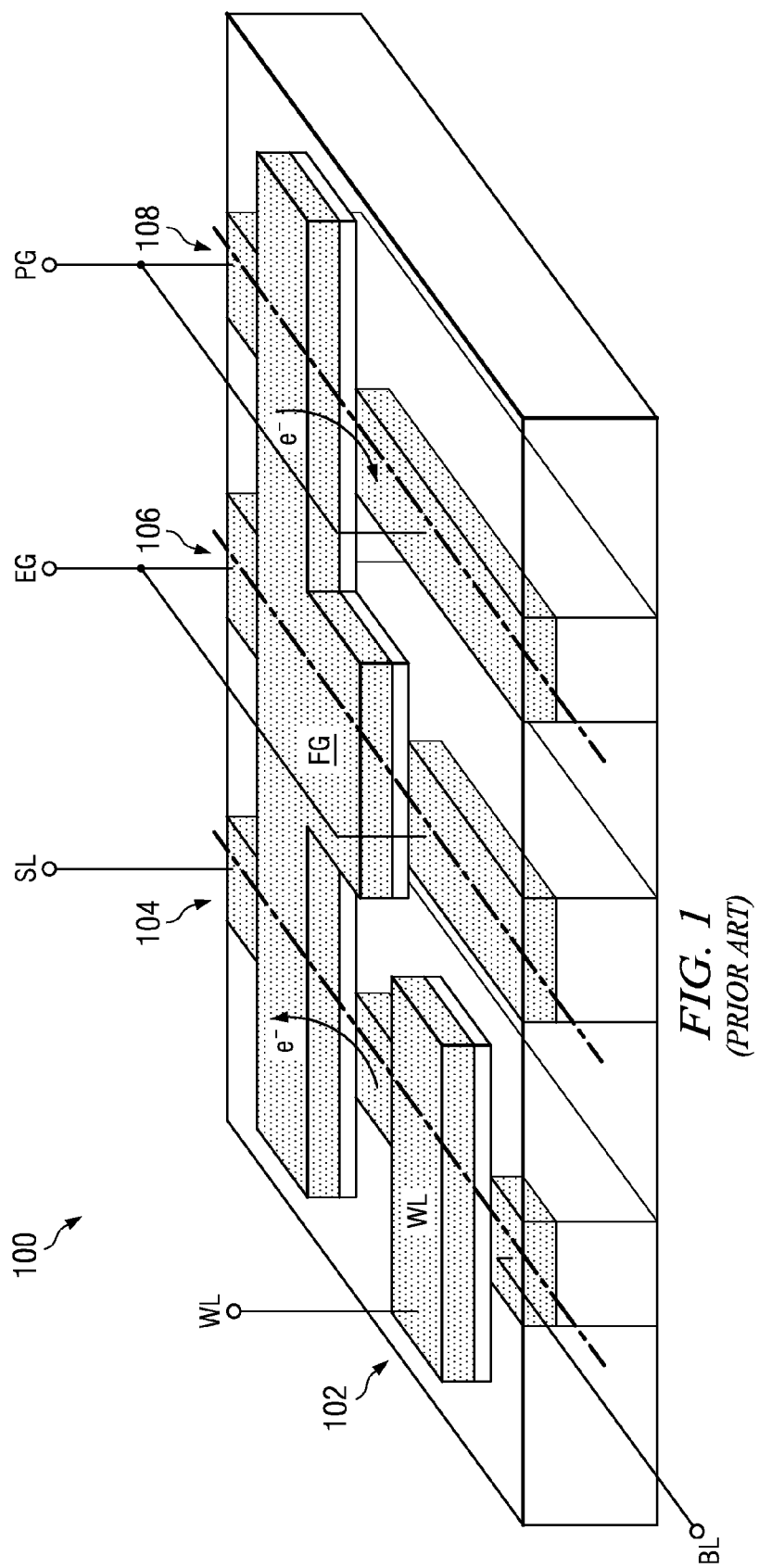
FIG. 1 illustrates a conventional non-volatile memory cell.
Figure 2:
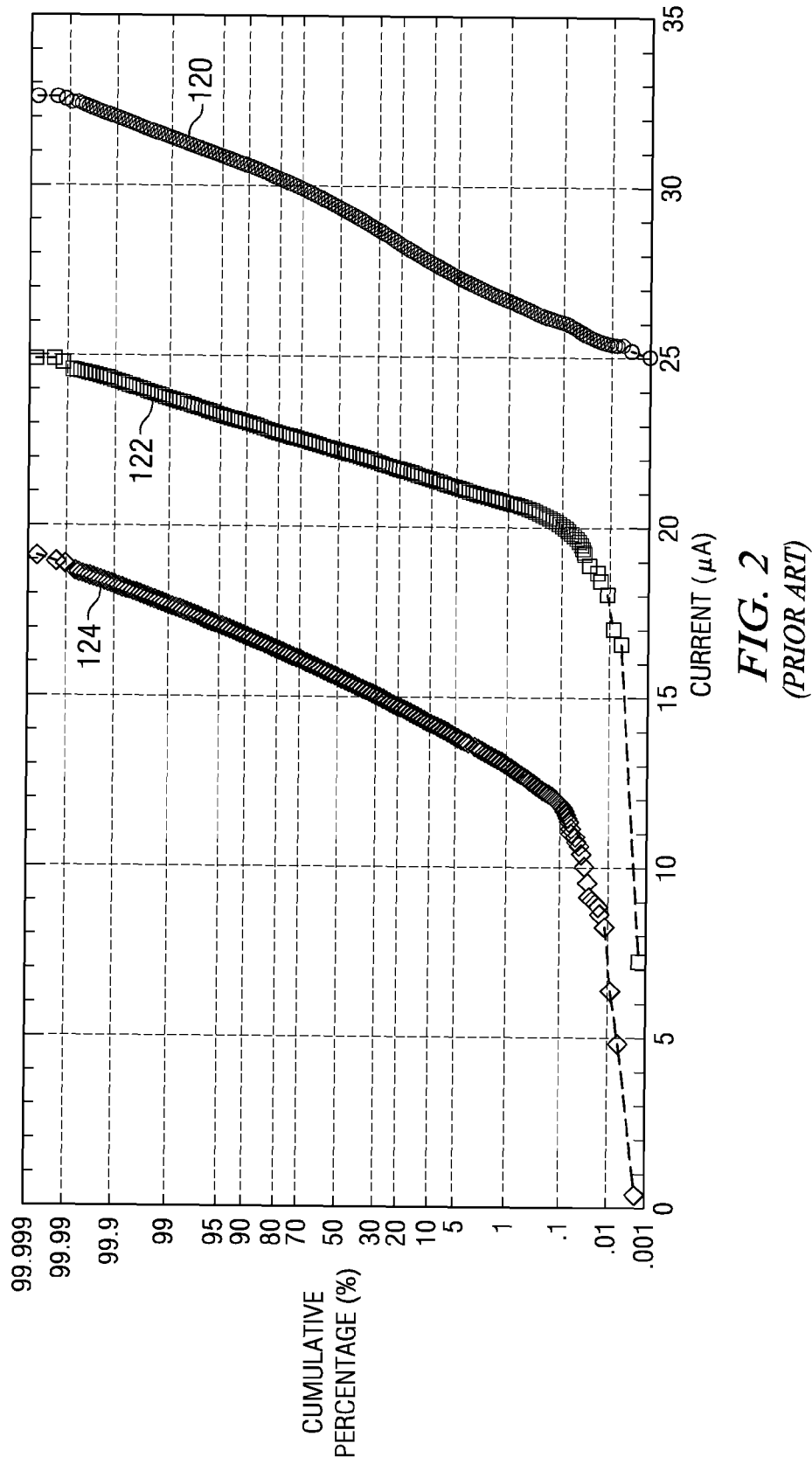
FIG. 2 illustrates measurement results of the conventional non-volatile memory cells.
Figure 3:
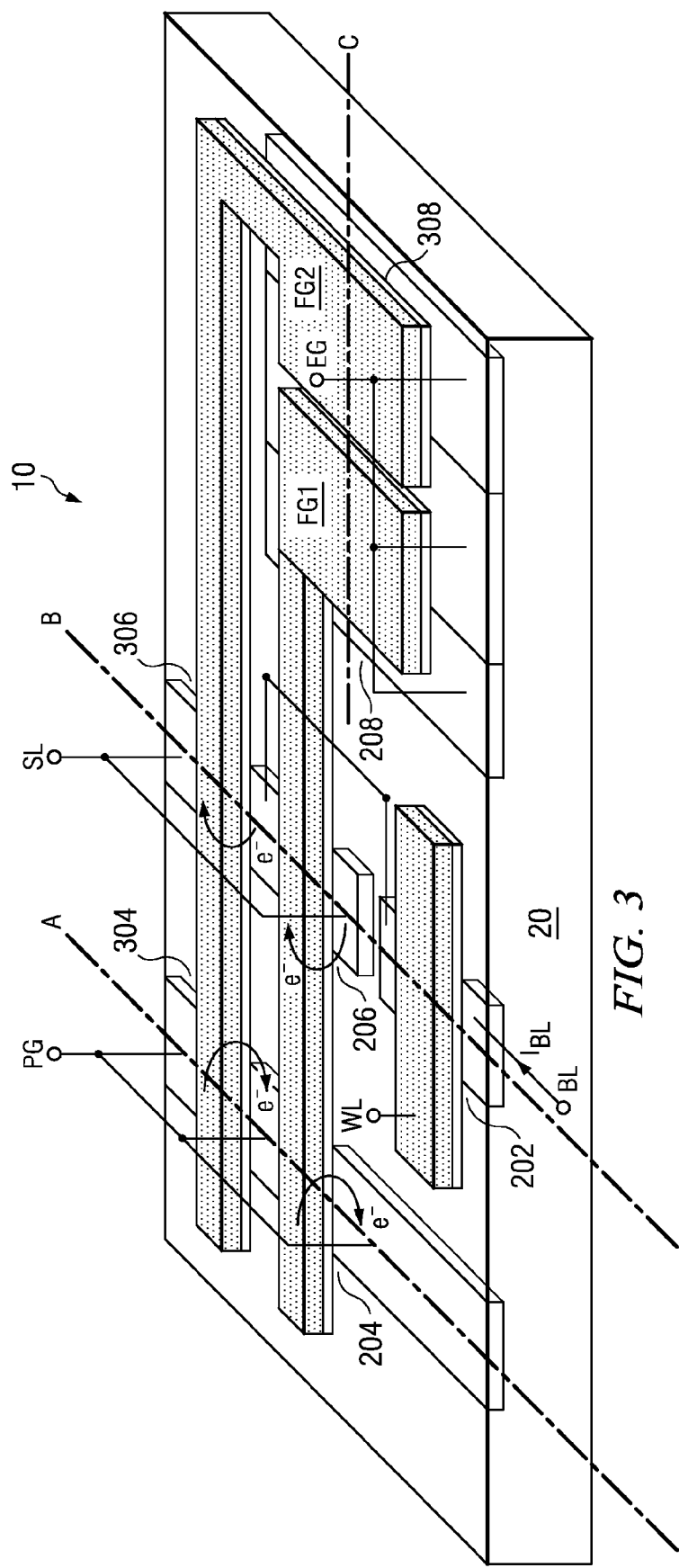
FIG. 3 illustrates a perspective view of a preferred embodiment of the present invention.

FIG. 3 illustrates a perspective view of non-volatile memory cell 10, which includes substrate 20 and floating gates FG1 and FG2 formed over substrate 20. Memory cell 10 includes a first capacitor (also referred to as a program-tunneling capacitor) 204, a first transistor 206, and a second capacitor (also referred to as a coupling capacitor) 208. The first capacitor 204, the first transistor 206, and the second capacitor 208 preferably share a common floating gate FG1. However, floating gate FG1 may also be physically separated into two or three portions, but electrically connected, wherein each of the three portions acts as a component in capacitor 204, transistor 206, and capacitor 208. Memory cell 10 further includes a third capacitor (program-tunneling capacitor) 304, a second transistor 306, and a fourth capacitor (coupling capacitor) 308. The third capacitor 304, second transistor 306, and the fourth capacitor 308 share a common floating gate FG2. Similarly, floating gate FG2 may also be separated into two or three physically separated, but electrically connected, portions. Transistors 206 and 306 are also referred to as erase-tunneling capacitors due to their functions in the erase operations.

Memory cell 10 further includes a third transistor (also referred to as a select transistor) 202, which is controlled by word line WL. One of the source/drain regions of the select transistor 202 is connected to bit line BL. The other source/drain region of the select transistor 202 is connected to (preferably through a metal line in a metallization layer) the drain regions of transistors 206 and 306. The source regions of transistors 206 and 306 are connected to a source line SL. The charges in floating gates FG1 and FG2 control the bit line current $I_{BL}$ flowing through bit line BL. The state of memory cell 10 is controlled by both floating gates FG1 and FG2, which are connected to each other in parallel. The source of select transistor 202 is physically isolated from the source of the first transistor 206 by an isolation region, for example, a shallow trench isolation (STI) region.

Figure 4:
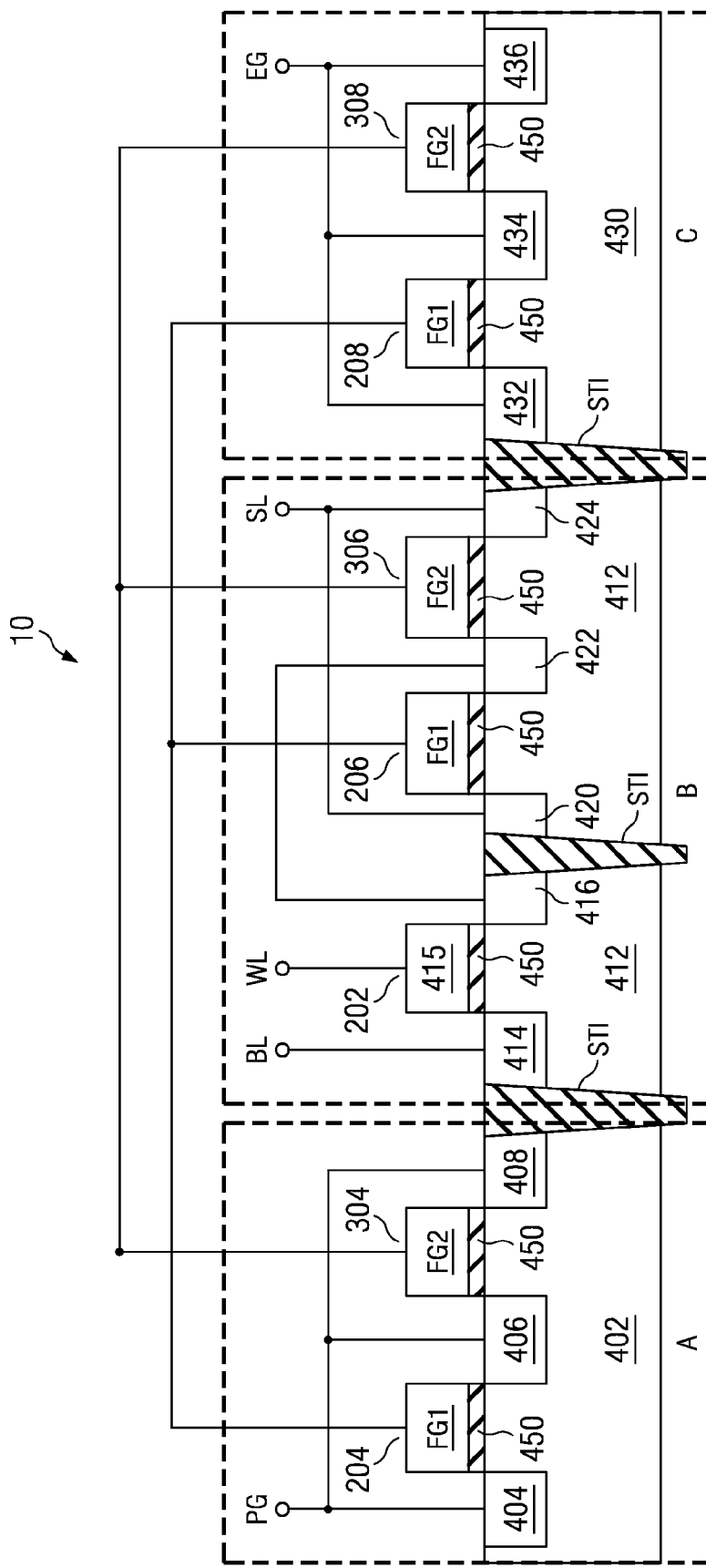
FIG. 4 illustrates cross-sectional views of the embodiment shown in FIG. 3.

FIG. 4 illustrates cross-sectional views of memory cell 10, wherein the cross-sectional views are taken along vertical planes crossing lines A, B, and C in FIG. 3, and the cross-sectional views are referred to as in regions A, B, and C, respectively. For simplicity purposes, throughout the description, the cross-sectional views of regions A, B, and C are shown as in one plane, although they may be in different planes. Please note that floating gate FG1 spans across regions A, B, and C, forming one of the two plates of capacitors 204 and 208, and the gate of the first transistor 206. Also, floating gate FG2 spans across regions A, B, and C, forming one of the two plates of capacitors 304 and 308, and the gate of the second transistor 306. The doped regions 404 and 406 are interconnected, forming a capacitor plate of capacitor 204, and are connected to a program gate (PG). The doped regions 406 and 408 are also interconnected to program PG, forming a capacitor plate of capacitor 304. The doped regions 432 and 434 are interconnected, forming a capacitor plate of capacitor 208, and are connected to an erase gate (EG). Similarly, the doped regions 434 and 436 are connected to erase gate EG, forming a capacitor plate of capacitor 308. Gate electrode 415 of the select transistor 202, which is connected to word line WL of a memory array, controls whether memory cell 10 is selected or not. Bit line BL is connected to doped region 414, and is used to detect the state stored by memory cell 10. The doped regions of the above-discussed devices may be isolated from each other by STI regions.

In an exemplary embodiment, capacitors 204 and 304 may be formed based on n-well 402, with active regions 404 and 408 heavily doped with an n-type impurity. Active region 406 is preferably heavily doped with a p-type impurity, although it may also be of n-type. The devices in region B may be formed based on p-well 412. Active regions 414, 416, 420, 422 and 424 are preferably of n-type. Capacitors 208 and 308 are formed based on n-well 430, with active regions 432 and 436 being of n-type, and active region 434 being of p-type. Floating gates FG1 and FG2 are preferably formed of conductive materials, such as doped polysilicon, metals, metal silicide, or the like. Gate dielectrics 450 may be formed of thermal silicon oxide, oxides comprising nitrogen, such as silicon nitride, or a composite material having an oxide/nitride/oxide structure. The materials and conductivity types of the above-discussed regions may be changed without changing the function of memory cell 10.

Figure 5:
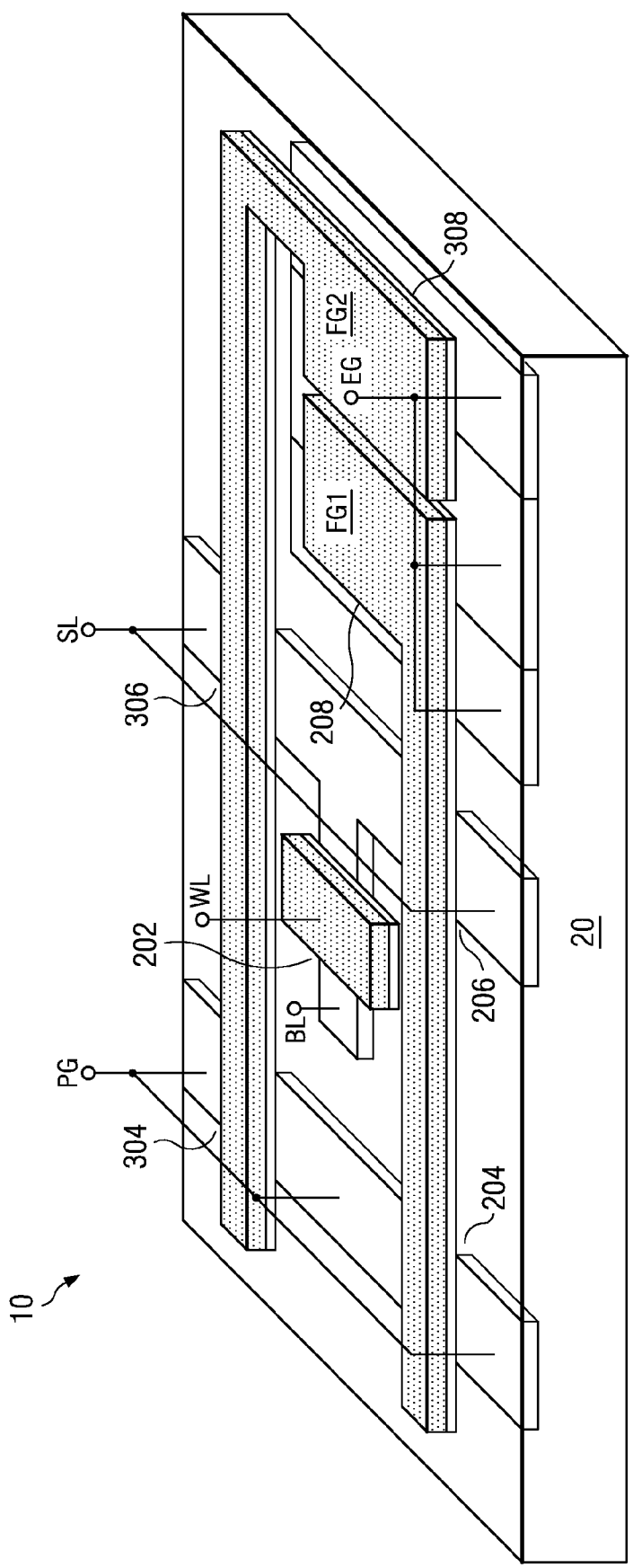
FIG. 5 illustrates a perspective view of an alternative embodiment of the present invention, which has a different layout than the embodiment shown in FIG. 3.

FIG. 5 illustrates a second embodiment of the present invention, which has a different layout than the first embodiment shown in FIG. 3. In this embodiment, the select transistor 202 is physically located between floating gates FG1 and FG2. Accordingly, a source/drain region of the select transistor 202 and the commonly shared source/drain regions of transistors 206 and 306 may form a continuous implant region. As illustrated in FIGS. 4 and 5, since transistors 206 and 306 share common source/drain region 422 (marked in FIG. 4, not marked in FIG. 5), no transistor is inserted between the common source/drain region 422 of transistor 206 and common source/drain region 422 of transistor 306, and used to decouple transistors 206 and 306 from each other.

Figure 6A:
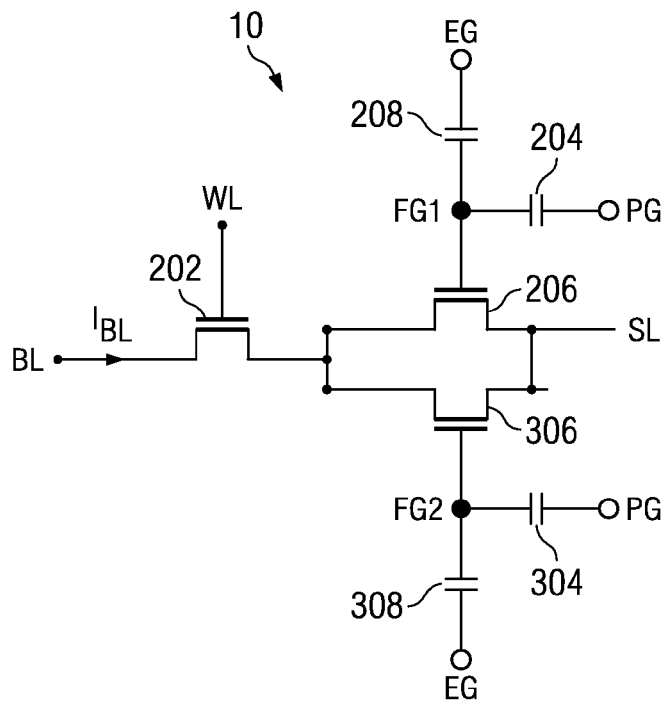
FIG. 6A illustrates an equivalent circuit of the embodiment shown in FIGS. 3 and 5.

An equivalent circuit of memory cell 10 is illustrated in FIG. 6A. It is noted that the equivalent circuit of memory cell 10 is symmetric, with a first portion (including devices 204, 206 and 208) being symmetric to a second portion (including devices 304, 306 and 308). The first and the second portions are redundant. If either of the first or second portion fails to function properly, memory cell 10 may still function as desired. The redundancy of memory cell 10 advantageously improves the reliability of memory cell 10, as will be discussed in detail in subsequent paragraphs.

Figure 6B:
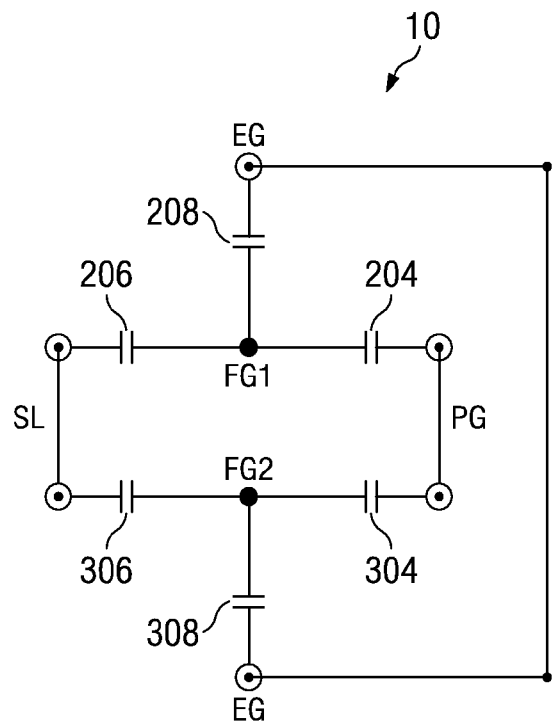
FIG. 6B illustrates another equivalent circuit of the embodiment shown in FIGS. 3 and 5, wherein only capacitors are shown.

FIG. 6B illustrates another equivalent circuit of memory cell 10, wherein only capacitors are illustrated. Since transistors 206 and 306 act as capacitors during erase operations, they are shown as capacitors 206 and 306, respectively. Using this equivalent circuit, the erase operations of memory cell 10 may be analyzed. The analysis is similar to what was provided in U.S. patent application publication No. 2007/0120172 A1, which has been incorporated herein by reference. The details are thus not repeated herein.

In the preferred embodiment, the erase and program operations are performed using Fowler Nordheim (FN) tunneling, in which the program operations may be defined as removing electrons from floating gates FG1 and FG2. Conversely, erase operations introduce electrons into floating gates FG1 and FG2. One skilled in the art will realize that the terms "erase" and "program" are terms of art, and can be defined differently.

Electrons may tunnel into or out of floating gates FG1 and FG2 depending on the voltages applied on nodes SL, EG, and PG. Table 1 illustrates an exemplary voltage setting for different operations, wherein $V_{WL}$ is the preferred voltage for word line WL, $V_{BL}(V)$ is the preferred voltage for bit line BL, and $V_{Bulk}$ is the preferred voltage for the bulk of semiconductor substrate 20.

TABLE 1

| Cell Operation | Voltage | | | | | |
|---|---|---|---|---|---|---|
| Voltage | $V_{PG}(V)$ | $V_{EG}(V)$ | $V_{SL}(V)$ | $V_{BL}(V)$ | $V_{WL}(V)$ | $V_{Bulk}(V)$ |
| Read | 0 | 0 | 0 | 0.5 | 0.9 | 0 |
| Program | 9.5 | 0 | 0 | 0 | 0 | 0 |
| Erase | 9.5 | 9.5 | 0 | 0 | 0 | 0 |

In an exemplary program operation, the voltage of program gate PG is about 9.5 volts, and the voltage of erase gate EG is about 0 volt, so that electrons tunnel from the floating gates FG1 and FG2 into substrate 20 through capacitors 204 and 304 (refer to FIG. 3), respectively. As a result, both floating gates FG1 and FG2 will have net holes after program operations.

In an exemplary erase operation, the voltage of program gate PG is about 9.5 volts, the voltage of erase gate EG is about 9.5 volts, and the voltage of source line SL is about 0V. Accordingly, referring to FIG. 6B, with the capacitances of capacitors 208 and 308 significantly greater than the capacitances of capacitors 206 and 306, a high voltage, for example, about 8 to 9 volts, is coupled to the floating gates FG1 and FG2. Since source line SL is applied with a voltage of 0V, high voltage differences are generated between the opposing plates of capacitors 206 and 306, causing electrons to be injected through capacitors 206 and 306 into the floating gates FG1 and FG2, respectively. To improve the program and erase efficiency, the capacitance of capacitor 208 is preferably significantly greater than the capacitance of capacitor 204, with a capacitance ratio, for example, between about 5 and about 30. Similarly, the capacitance of capacitor 308 is preferably significantly greater than the capacitance of capacitor 304, with the similar capacitance ratio.

The preferred embodiment of the present invention, as previously discussed, uses FN tunneling as the mechanism of program and erase operations. Advantageously, in the FN tunneling, the current consumptions during program and erase operations are very low because memory cell 10 is at the "off" state. In alternative embodiments, a hot-carrier injection (HCI) mechanism can be used, in which channel hot electrons (CHE) having higher energies are involved. Converse to the previously defined program and erase operations in FN tunneling, the program operation using HCI may be defined as injecting electrons into floating gates FG1 and FG2, and the erase operation may be defined as removing electrons from floating gates FG1 and FG2. For hot-carrier injections, the current consumption is high because memory cell 10 is operated at an "on" state.

Referring back to FIG. 3, when programmed, memory cell 10 will have enough holes stored in floating gates FG1 and FG2 to turn on transistors 206 and 306, respectively. When erased, transistors 206 and 306 will be at the "off" state since the voltages on floating gates FG1 and FG2 are lower than the threshold voltages of transistors 206 and 306, respectively. In an exemplary read operation, word line WL is applied with about 0.9V to turn on select transistor 202. If memory cell 10 is programmed, transistors 206 and 306 are turned on, and hence a bit line current $I_{BL}$ flows through bit line BL, select transistor 202, and transistors 206 and 306, and flows into source line SL. Conversely, if memory cell 10 is erased, transistors 206 and 306 are turned off, and hence no bit line current flows through bit line BL. The state of memory cell 10 can thus be determined based on the magnitude of bit line current $I_{BL}$.

With time, the charges stored in floating gates FG1 and FG2 may leak. For example, electrons may leak into floating gates FG1 and FG2 to neutralize the holes stored therein. Since memory cell 10 is preferably formed simultaneously with logic circuit devices in the same chip, gate dielectrics 450 (refer to FIG. 4) will be formed of a same material, and have a same thickness, as logic circuit devices. With the reduction in the scale of logic integrated circuits, the thickness of gate dielectrics 450 is also reduced, for example, to about 70 Å or even below. Accordingly, the leakage of the charges in floating gates FG1 and FG2 becomes even more significant.

The leakage, however, typically occurs randomly among memory cells in an array, with a very small percentage of memory cells in the memory array leaking significantly faster than others. With the redundant design of memory cell 10, if one of the floating gates, FG1 or FG2, experiences leakage and cannot turn on the respective transistors 206 and 306, the other one can still turn on the respective transistor, allowing bit line current $I_{BL}$ to flow. The respective memory cell may still function correctly. Accordingly, the data retention time of memory cell 10 is significantly prolonged, and the reliability is significantly improved. For example, assuming after a long storage time, the probability of one floating gate causing an erroneous reading is $1\times10^{-5}$, then the probability of both floating gates in the same memory cell causing an erroneous reading is reduced to $1\times10^{-10}$.

Figure 7:
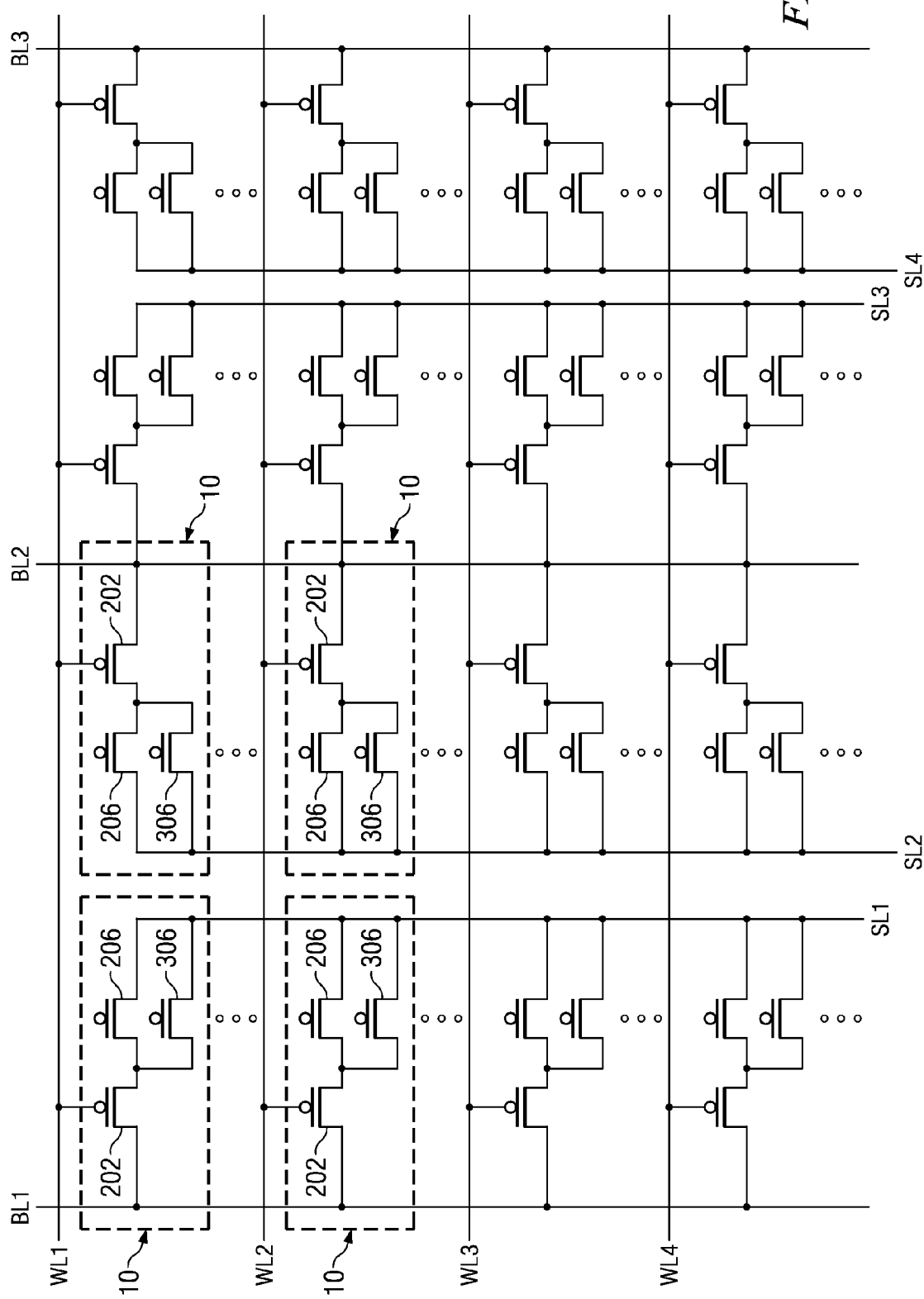
FIG. 7 schematically illustrates an array formed of the memory cell embodiments of the present invention.

FIG. 7 illustrates an exemplary array formed using the embodiments of the present invention, wherein the circuits inside each of the ellipses symbolizes a memory cell 10. FIG. 7 shows that each of the select transistors 202 is connected to transistors 206 and 306 in parallel, which are further connected to source lines SL. The other details of memory cells 10 are not shown.

Figure 8:
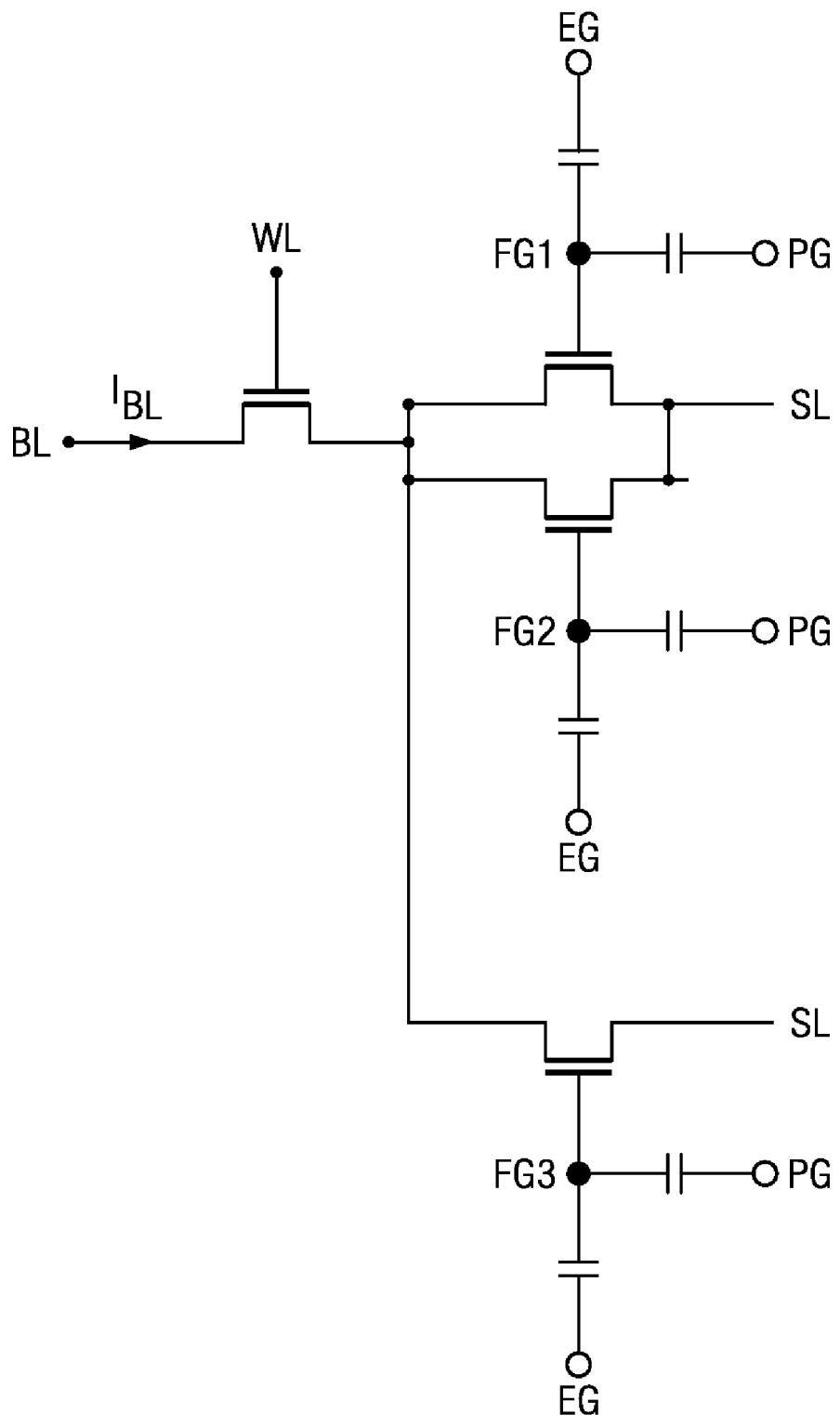
FIG. 8 illustrates an equivalent circuit of an alternative embodiment of the present invention, which includes three floating gates.

It is realized that in other embodiments of the present invention, a memory cell may include additional floating gates, with each of the first, the second, and the additional floating gates being redundant for others. FIG. 8 illustrates an exemplary equivalent circuit of a memory cell including three floating gates, wherein the circuit formed of a third floating gate FG3 is connected to the circuits formed of the first and the second floating gates FG1 and FG2 in parallel.

Figure 9:
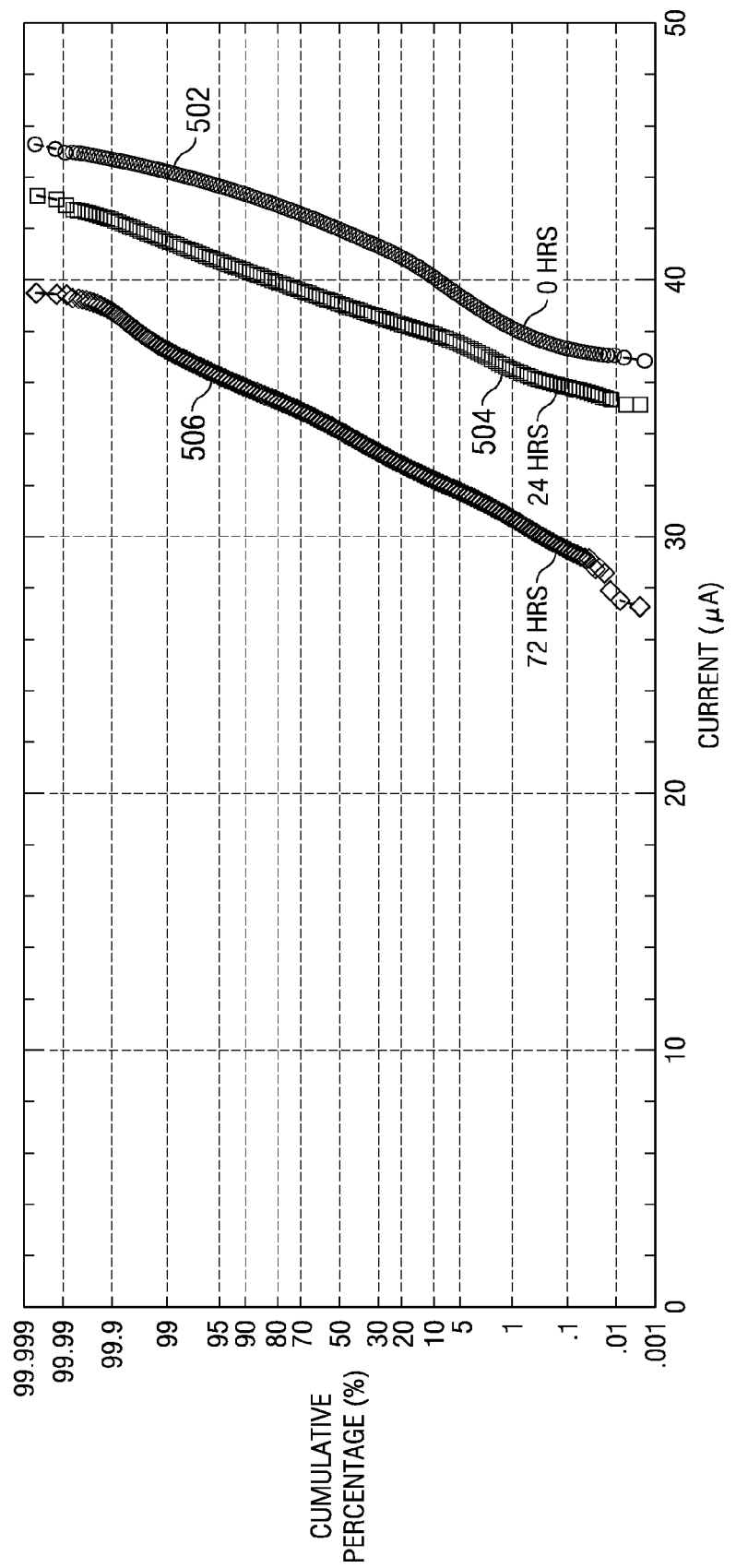
FIG. 9 illustrates measurement results of the memory cell embodiments of the present invention.

FIG. 9 illustrates test results of sample memory cells having the structure shown in FIG. 3, wherein cumulative percentages are illustrated as the function of bit line currents measured from the sample memory cells. The sample memory cells are baked at 250° C. to accelerate the leakages. Measurement results 502 were obtained before the baking, measurement results 504 were obtained after 24 hours of baking, while measurement results 506 were obtained after 72 hours of baking. It was found that after baking for 24 and 72 hours, no sample memory cell failed. Furthermore, after baking for 72 hours, the read margin is still greater than about 35 μA, which is significantly greater than the 15 μA read margin obtained from conventional one-floating gate cell.

The embodiments of the present invention have several advantageous features. First, the reliability of the memory cells is significantly improved, which allows the non-volatile memory cells to be fabricated using lower-scale techniques without sacrificing the reliability. The improvement in the reliability, however, does not necessarily result in the increase in the cell area, partially due to the fact that well-to-well isolation dominates the chip area usage. By adjusting the layout, the memory cell embodiments of the present invention may consume substantially the same chip area as conventional one-floating gate memory cells.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-volatile memory cell comprising:
   a semiconductor substrate;
   a first transistor comprising:
      a first dielectric over the semiconductor substrate; and
      a first floating gate over the first dielectric;
   a second transistor electrically coupled to the first transistor, the second transistor comprising:
      a second dielectric over the semiconductor substrate; and
      a second floating gate over the second dielectric, wherein the first and the second floating gates are electrically disconnected;
   a first capacitor;
   a second capacitor electrically coupled to the first capacitor;
   a third capacitor;
   a fourth capacitor electrically coupled to the third capacitor, wherein each of the first, the second, the third, and the fourth capacitors comprises the semiconductor substrate as one of capacitor plates;
   a third transistor as a selector of the non-volatile memory cell, wherein the third transistor is electrically coupled to the first and the second transistors, and wherein sources of the first and the second transistors are connected to each other when the selector is turned on and when the selector is turned off, and drains of the first and the second transistors are connected to each other when the selector is turned on and when the selector is turned off; and
   a bit line electrically connected to a first source/drain region of the third transistor, wherein a second source/drain region of the third transistor is electrically connected to a second source/drain region of each of the first and the second transistors.

2. The non-volatile memory cell of claim 1, wherein the first and the second transistors share a common active region as one of the source/drain regions.

3. The non-volatile memory cell of claim 1, wherein the first and the second capacitors are electrically coupled to the first floating gate.

4. The non-volatile memory cell of claim 3, wherein the third and the fourth capacitors are electrically coupled to the second floating gate.

5. The non-volatile memory cell of claim 3, wherein the first and the second capacitors each comprises the first floating gate as one of capacitor plates.

6. The non-volatile memory cell of claim 3 further comprising:
a source line connected to a first source/drain region of each of the first and the second transistors; and
a word line connected to a gate electrode of the transistor.

7. A non-volatile memory cell comprising:
a semiconductor substrate;
a first transistor comprising:
a first dielectric over the semiconductor substrate; and
a first floating gate over the first dielectric;
a second transistor electrically coupled to the first transistor, the second transistor comprising:
a second dielectric over the semiconductor substrate; and
a second floating gate over the second dielectric, wherein the first and the second floating gates are electrically disconnected, and wherein source regions of the first and the second transistors are interconnected, and drain regions of the first and the second transistors are interconnected;
a first capacitor comprising the first floating gate as one of capacitor plates;
a second capacitor comprising the first floating gate as one of capacitor plates;
a third capacitor comprising the second floating gate as one of capacitor plates;
a fourth capacitor comprising the second floating gate as one of capacitor plates;
a third transistor comprising a first source/drain region connected to one of the interconnected source regions and the interconnected drain regions of the first and the second transistors;
a third floating gate over and electrically disconnected from the first and the second floating gates;
a fifth capacitor comprising the third floating gate as one of capacitor plates; and
a sixth capacitor comprising the third floating gate as one of capacitor plates.

8. The non-volatile memory cell of claim 7, wherein the first capacitor has a smaller capacitance than the second capacitor, and the third capacitor has a smaller capacitance than the fourth capacitor.

9. The non-volatile memory cell of claim 8, wherein:
the first capacitor comprises a first capacitor plate, wherein the first capacitor plate comprises a first active region, and a second active region interconnected to the first active region; and
the second capacitor comprises a second capacitor plate, wherein the second capacitor plate comprises the second active region, and a third active region interconnected to the second active region, and wherein the second active region has an opposite conductivity type than the first and the third active regions.

10. The non-volatile memory cell of claim 9, wherein:
the third capacitor comprises a third capacitor plate, wherein the third capacitor plate comprises a fourth active region, and a fifth active region interconnected to the fourth active region; and
the fourth capacitor comprises a fourth capacitor plate, wherein the fourth capacitor plate comprises the fifth active region, and a sixth active region interconnected to the fifth active region, and wherein the fifth active region has an opposite conductivity type than the fourth and the sixth active regions.

11. The non-volatile memory cell of claim 7 further comprising:
a source line connected to the interconnected source regions of the first and the second transistors;
a word line connected to a gate electrode of the third transistor; and
a bit line connected to a second source/drain region of the third transistor.

12. A non-volatile memory cell comprising:
a semiconductor substrate;
a first dielectric over the semiconductor substrate;
a first floating gate over the first dielectric;
a second dielectric over the semiconductor substrate;
a second floating gate over the second dielectric and electrically disconnected from the first floating gate;
a first, a second, and a third implanted region in the semiconductor substrate and adjacent the first floating gate, wherein the first, the second, and the third implanted regions are isolated by insulation regions in the semiconductor substrate;
a fourth, a fifth, and a sixth implanted region in the semiconductor substrate and adjacent the first and the second floating gates, wherein the fourth, the fifth, and the sixth implanted regions are isolated by the insulation regions;
a seventh, a eighth, and a ninth implanted region in the semiconductor substrate and adjacent the second floating gate, wherein the seventh, the eighth, and the ninth implanted regions are isolated by the insulation regions;
a third gate dielectric over the semiconductor substrate;
a word line over the third gate dielectric;
a tenth implanted region in the semiconductor substrate and adjacent the word line; and
an eleventh implanted region in the semiconductor substrate and adjacent the word line, wherein the eleventh implanted region is electrically connected to the fifth implanted region.

13. The non-volatile memory cell of claim 12 further comprising:
a bit line connected to the tenth implanted region; and
a source line connected to the second and the eighth implanted regions.

14. The non-volatile memory cell of claim 12, wherein the fourth and the sixth implanted regions are of p-type, and wherein the first, the second, the third, the fifth, the seventh, the eighth, and the ninth implanted regions are of n-type.

15. The non-volatile memory cell of claim 12, wherein the first, the fourth, and the seventh implanted regions are interconnected, the second and the eighth implanted regions are interconnected, and the third, the sixth, and the ninth implanted regions are interconnected.

16. The non-volatile memory cell of claim 15, wherein the first, the fourth, and the seventh implanted regions are con nected to a program node, and wherein the third, the sixth, and the ninth implanted regions are connected to an erase node.

17. The non-volatile memory cell of claim 1, wherein the drains of the first and the second transistors are directly connected.

18. The non-volatile memory cell of claim 7, wherein the third transistor is physically located between the first and the second transistors.

19. The non-volatile memory cell of claim 7, wherein the third transistor is physically located on a same side of the first and the second transistors, and wherein the third transistor is electrically connected to an active region commonly shared by the first and the second transistors.

* * * * *